United States Patent [19]

Bakhmutsky

[11] Patent Number: 5,686,916
[45] Date of Patent: Nov. 11, 1997

[54] MULTI-CODE-BOOK VARIABLE LENGTH DECODER

[75] Inventor: Michael Bakhmutsky, Spring Valley, N.Y.

[73] Assignee: Philips Electronics North America Corp., New York, N.Y.

[21] Appl. No.: 580,404

[22] Filed: Dec. 28, 1995

[51] Int. Cl.$^6$ .................................................. H03M 7/40
[52] U.S. Cl. .......................... 341/67; 341/100; 341/106
[58] Field of Search .................................. 341/67, 82, 88, 341/100, 106; 348/423

[56] References Cited

U.S. PATENT DOCUMENTS

| | | | |
|---|---|---|---|
| 3,918,047 | 11/1975 | Denen | 340/347 DD |
| 4,509,038 | 4/1985 | Hirano | 340/347 DD |
| 5,173,695 | 12/1992 | Sun et al. | 341/67 |
| 5,363,097 | 11/1994 | Jan | 341/67 |
| 5,428,356 | 6/1995 | Ozaki | 341/67 |

FOREIGN PATENT DOCUMENTS

| | | |
|---|---|---|
| 0614317 | 9/1994 | European Pat. Off. . |
| 0631440 | 12/1994 | European Pat. Off. . |

*Primary Examiner*—Todd E. DeBoer

[57] ABSTRACT

A multi-code-book variable length decoder for decoding an input bit stream containing a plurality of variable length code words includes a plurality of individual variable length decoders and a controller. Each of the individual variable length decoders receives the input bit stream and decodes the input bit stream according to a different respective code book. The controller receives the input bit stream and, for each successive code word contained in the input bit stream, selects a correct one of the plurality of individual variable length decoders for decoding that code word. Each of the individual variable length decoders, when selected, operates in an active decoding mode to decode each successive bit of the input bit stream until detecting an end of a current code word contained in the input bit stream, and when not selected, operates in a passive decoding mode to pre-decode each successive bit of the input bit stream as if it were an initial bit of a next code word contained in the input bit stream, and belonging to its own code book. Each of the individual variable length decoders, when selected, produces an end-of-word signal upon detecting the end of the current code word. The controller receives the end-of-word signals produced by the individual variable length decoders, and, in response thereto, makes a decision as to which one of the individual variable length decoders is the correct one for decoding the next code word. Each of the individual variable length decoders, when selected, produces a decoded word at its output. The decoded words produced by the individual variable length decoders are multiplexed by a multiplexer which produces a decoded word stream at its output. The controller determines the type of each successive code word contained in the input bit stream according to a prescribed communication protocol, e.g., an MPEG protocol, and makes the decision as to which one of the individual variable length decoders is the correct one, on the basis of this determination. The operation of the individual variable length decoders is thus fully pipelined, so that no input buffers are needed to compensate for decision latency of the controller.

20 Claims, 3 Drawing Sheets

MULTI-CODE-BOOK VARIABLE LENGTH DECODER

BACKGROUND OF THE INVENTION

The present invention relates generally to variable length decoders, and, more particularly, to a novel, multi-code-book variable length decoder.

Variable length decoders (VLDs) are widely used in the field of digital communications to decode statistically encoded bit streams consisting of words of variable length. In some applications, such as in the transmission of digitally compressed images (e.g., digital video), multiple coding tables or "code books" are used to encode different types of data, in order to thereby optimize coding efficiency. In order to decode a bit stream which consists of different types of variable length words which are encoded according to different respective code books, it is necessary to use a VLD which utilizes multiple code books. Such a VLD is referred to as a "multi-code-book VLD".

In general, a multi-code-book VLD must be capable of simultaneously functioning as a decoder and as a future code book predictor. In this connection, a communication protocol is normally designed for correct future code book selection based on the currently available decoded results. The MPEG ("Moving Pictures Expert Group") protocol for transmission of digitally compressed video is an example of such a protocol.

The performance of a multi-code-book VLD is often described in terms of its speed of operation. Given the complexity of communication protocols and coding tables in many applications, e.g., in the transmission of digitally compressed video, the multi-code-book VLD is usually implemented by being partitioned into a plurality of separate VLDs, each having its own code book. Such decoder partitioning generally results in a slower speed of operation of the multi-code-book VLD. Asynchronous solutions for selecting the appropriate VLD for each code word in the incoming bit stream to be decoded generally result in poor performance of the multi-code-book VLD. Synchronous or pipelined solutions for selecting the appropriate VLD generally result in more reliable, higher speed performance of the multi-code-book VLD. However, such sychnronous or pipelined solutions impose an additional system requirement, namely, the requirement of buffering the incoming bit stream in order to overcome a problem of skipped bits, i.e., bits which are not decoded due to decision latency of the multi-code-book VLD. The decision latency is due to the time required to detect the end of the most recently decoded code word and to make a decision as to which of the plurality of VLDs of the multi-code-book VLD is the correct VLD for the next code word in the bit stream to be decoded. The decision latency interval is the time period between the time that the last bit of the most recently decoded code word is decoded and the time that the correct VLD is activated to begin decoding the next code word.

The above-mentioned problem associated with pipelined multi-code-book VLDs will now be described with reference to FIG. 1. More particularly, a pipelined multi-code-book VLD (not shown) functions to decode a current code word n contained in an incoming bit stream, and, to then decode the next code word n+1 contained in the incoming bit stream. An individual variable length decoder of the pipelined multi-code-book VLD detects when the last bit "20" of the current code word n has been decoded, and generates an end of word n pulse EW in response thereto. The duration of this pulse is one clock cycle. During this interval, a system controller (not shown), in accordance with the operative communication protocol and on the basis of the decoding results which have become available during this clock cycle, and on the basis of previous decoding results, makes the decision as to which of the individual VLDs of the multi-code-book VLD is the correct one for decoding the next code word n+1, and issues a VLDn+1 select decision pulse SD for selecting (activating) the correct one of the individual VLDs for decoding the next code word n+1.

The time required for the system controller to make the decision as to which of the individual VLDs is the correct one for decoding the next code word n+1 and to issue the VLDn+1 select decision pulse SD to select (activate) the correct VLD, is a single clock cycle (i.e., the duration of the end of word n pulse EW), as indicated by the coincidence of the rising edge of the VLDn+1 select decision pulse SD with the falling edge of the end of word n pulse EW. This single bit clock cycle corresponds to the bit clock cycle for decoding the first bit "1" of the next code word n+1, and is referred to as the "decision latency interval" (DLI).

The selected (correct) VLD is activated in response to the select decision pulse SD to begin decoding the next code word n+1 at the start of the next cycle of the bit clock, i.e., beginning with the second bit "2" of the next code word n+1. Thus, as can be readily appreciated, the first bit "1" of the next code word n+1 is skipped, i.e., not decoded. In order to overcome this problem, the system controller must generate a signal which inhibits decoding of bit "1" of the next code word n+1 during this decision latency interval DLI. This not only causes a reduction in processing speed, but also requires a memory buffer of sufficient size to ensure that portions of the incoming bit stream in front of the multi-code-book VLD are not lost.

Based on the above and foregoing, it can be appreciated that there presently exists a need in the art for a fully pipelined multi-code-book VLD which overcomes the above-described drawbacks and shortcomings of the presently available pipelined multi-code-book VLDs. The present invention fulfills this need.

SUMMARY OF THE INVENTION

The present invention encompasses a multi-code-book variable length decoder for decoding an input bit stream containing a plurality of variable length code words. The multi-code-book variable length decoder includes a plurality of individual variable length decoders and a controller. Each of the individual variable length decoders receives the input bit stream and decodes the input bit stream according to a different respective code book. The controller receives the input bit stream and, for each successive code word contained in the input bit stream, selects a correct one of the plurality of individual variable length decoders for decoding that code word.

Each of the individual variable length decoders, when selected, operates in an active decoding mode to decode each successive bit of the input bit stream until detecting an end of a current code word contained in the input bit stream, and when not selected, operates in a passive decoding mode to pre-decode each successive bit of the input bit stream as if it were an initial bit of a next code word contained in the input bit stream, and belonging to its own code book.

Each of the individual variable length decoders, when selected, produces an end-of-word signal upon detecting the end of the current code word. The controller receives the end-of-word signals produced by the individual variable length decoders, and, in response thereto, makes a decision as to which one of the individual variable length decoders is the correct one for decoding the next code word, based on previously decoded code words and in accordance with a prescribed communication protocol (e.g., an MPEG protocol). Each of the individual variable length decoders, when selected, also produces a decoded word at its output.

The decoded words produced by the individual variable length decoders are multiplexed by a multiplexer which produces a decoded word stream at its output. The controller determines the type of each successive code word contained in the input bit stream based on previously decoded coded words and according to the prescribed communication protocol, and makes the decision as to which one of the individual variable length decoders is the correct one, on the basis of this determination. The operation of the individual variable length decoders is thus fully pipelined, so that no input buffers are needed to compensate for decision latency of the controller.

For each successive code word contained in the input bit stream, only the correct one of the plurality of individual variable length decoders is selected, and the remaining ones of the plurality of individual variable length decoders are not selected, whereby the correct, selected one of the plurality of individual variable length decoders operates in the active decoding mode, and the remaining, non-selected ones of the plurality of individual variable length decoders operate in the passive decoding mode. Each of the individual variable length decoders has a respective plurality of entry states and a respective plurality of subsequent states. Each of the individual variable length decoders, when operating in the passive decoding mode, branches between its respective entry states according to the value of a current bit of the input bit stream. Each of the individual variable length decoders, in response to being selected by the controller, changes from the passive decoding mode to the active decoding mode, whereby it branches to an appropriate one of its respective subsequent states, from the correctly established entry state. Thus, each of the individual variable length decoders, upon being selected by the controller, has already pre-decoded the first bit of the next code word contained in the input bit stream.

BRIEF DESCRIPTION OF THE DRAWINGS

These and various other features and advantages of the present invention will be more clearly understood from the following detailed description taken in conjunction with the accompanying drawings, in which.

DETAILED DESCRIPTION OF THE INVENTION

Figure 1:
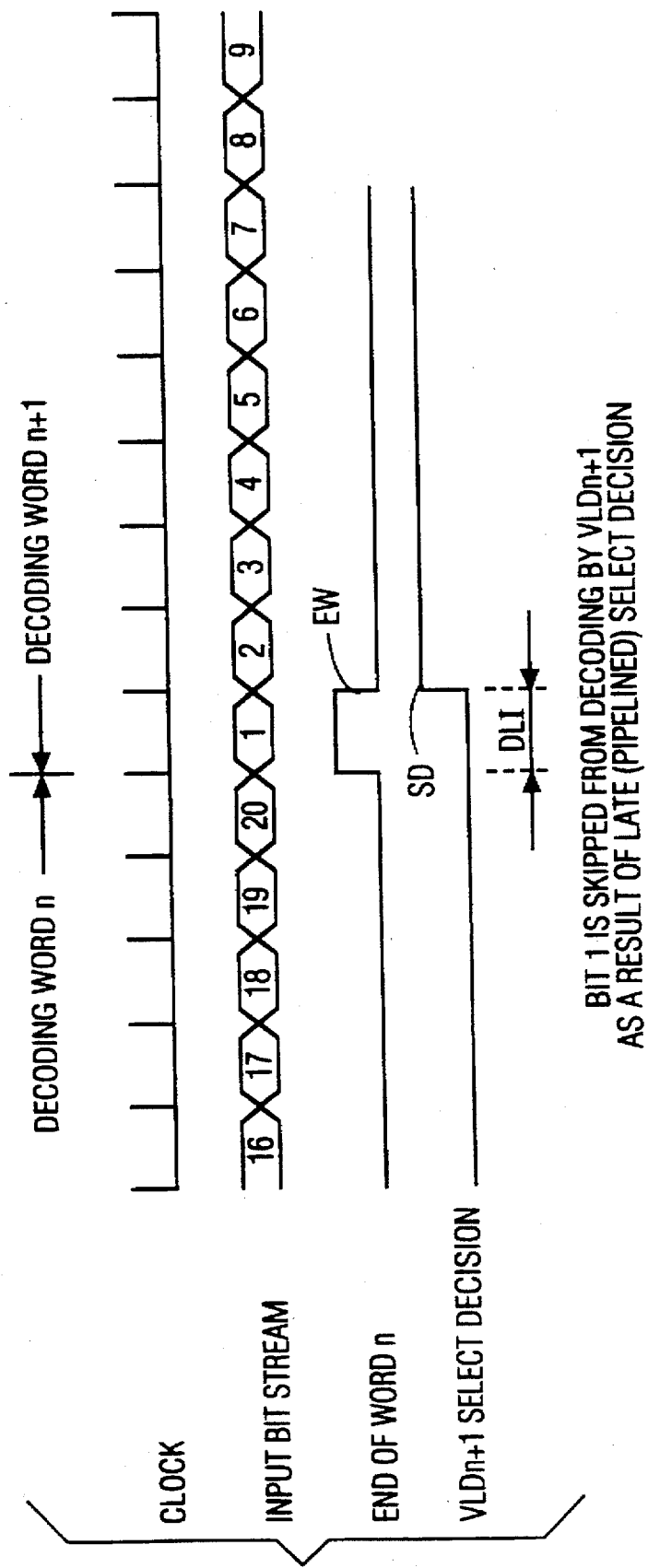
FIG. 1 is a timing diagram illustrating the problem of skipped bits due to decision latency of a multi-code-book VLD in detecting the end of a current code word and selecting the correct VLD for the next code word in a bit stream to be decoded.
Figure 2:
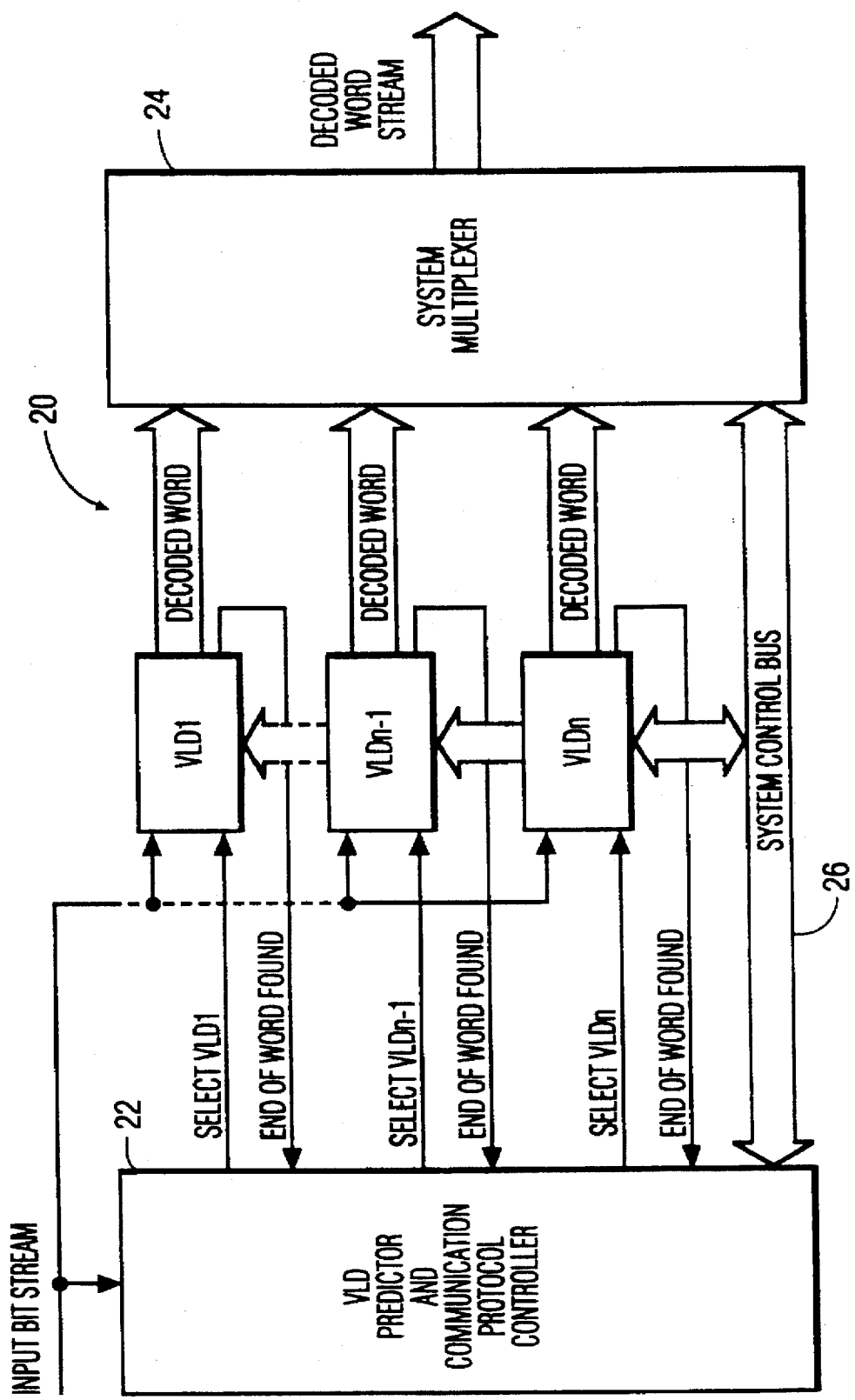
FIG. 2 is a block diagram of a fully pipelined multi-code-book VLD constructed in accordance with a preferred embodiment of the present invention; and, FIG. 3 is a state diagram illustrating the decoding operation performed by the fully pipelined multi-code-book VLD of the present invention depicted in FIG. 2.

With reference now to FIG. 2, a multi-code-book VLD 20 constructed in accordance with a preferred embodiment of the present invention will now be described. As can be seen, the multi-code-book VLD 20 is partitioned into a plurality n of individual VLDs designated VLD1-VLDn, each having its own respective code book. The individual decoders VLD1-VLDn are controlled by a VLD predictor and communication protocol controller 22, which detects the ends of the successive code words contained in the input bit stream and selects the correct one of the VLDs for decoding each successive code word. In general, the VLD predictor and communication protocol controller 22 receives end of word pulses EW from the individual decoders VLD1-VLDn and issues select decision pulses SD, in a pipelined fashion, as illustrated in FIG. 1 and discussed hereinabove. The decoded words output by the individual decoders VLD1-VLDn are multiplexed by a system multiplexer 24, which outputs a decoded word stream. The data exchange between the controller and the individual decoders VLD1-VLDn and the system multiplexer 24 is accomplished through a system control bus 26, in a manner readily apparent to those skilled in the art.

With additional reference now to FIG. 3, the operation of the multi-code-book VLD 20 of the preferred embodiment of the present invention will now be described. More particularly, the controller 20 monitors the input bit stream and determines the type of each successive code word contained in the input bit stream, based upon the operative communication protocol (e.g., MPEG). Based upon this determination, the controller 20 issues a select decoder command (Select VLD1 ... VLDn) for selecting (activating) the correct one of the individual decoders VLD1-VLDn for decoding a current code word of the determined type. In this connection, each of the individual decoders VLD1-VLDn utilizes a different respective code book for decoding a different respective type of code word.

In general, a selected one of the individual decoders VLD1-VLDn operates in an active decoding mode to decode the input bit stream according to its code book until it finds the end of the current code word. The remaining, unselected ones of the individual decoders VLD1-VLDn operate in a passive decoding mode to decode every bit of the input bit stream as if it were the beginning of a code word according to its own code book. Unselected ones of the individual decoders VLD1-VLDn branch between a plurality of entry states (indicated by encircled 1's in FIG. 3), advancing only one step forward until selected. When an unselected one VLDi of the individual decoders VLD1-VLDn is selected (activated) in response to the pipelined select decoder command (Select VLDi) issued by the controller 22, its operation is switched to the active decoding mode to decode a next code word contained in the input bit stream, and the previously selected one of the individual decoders VLD1-VLDn is switched to the passive decoding mode described above.

Figure 3:
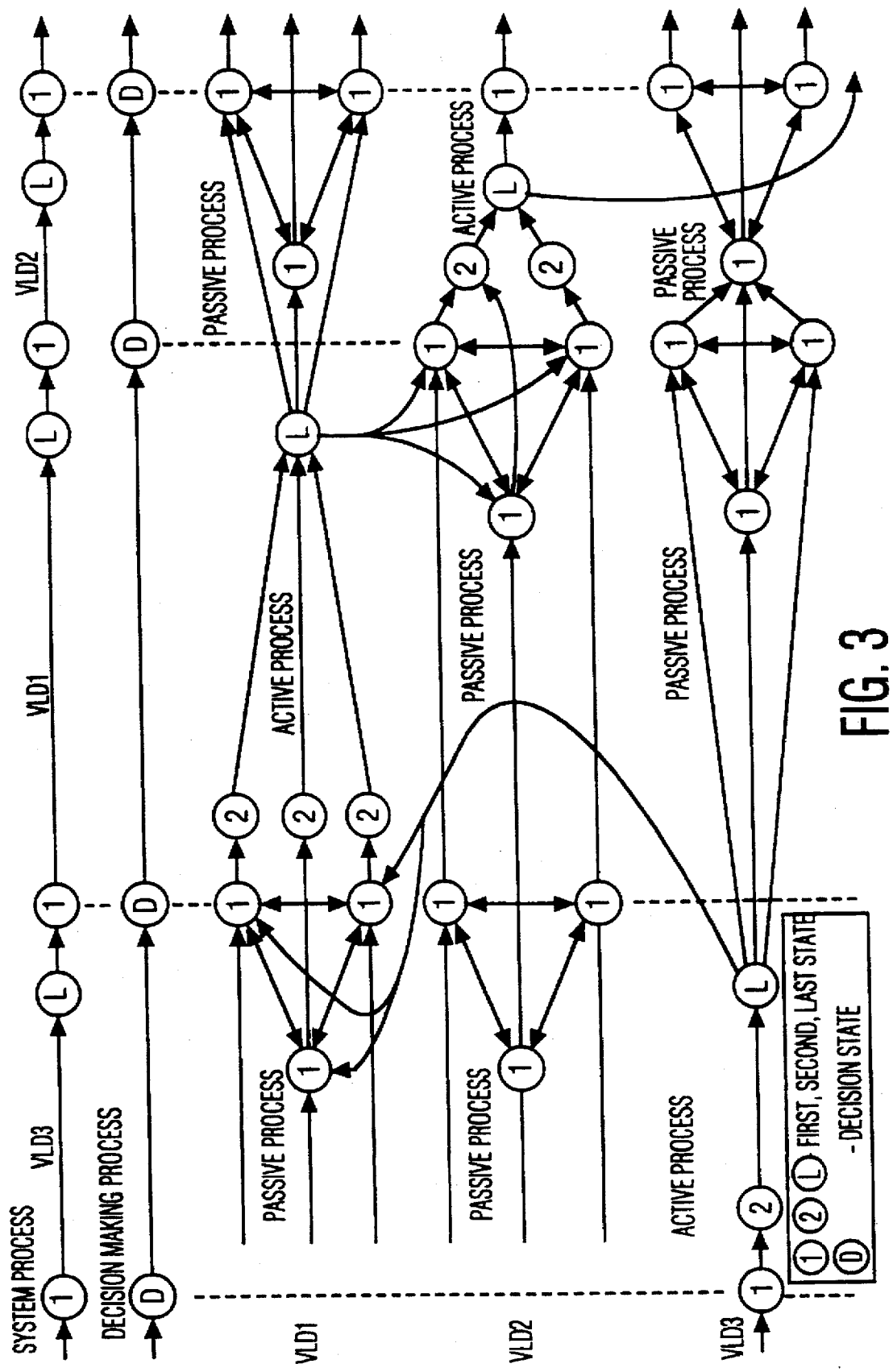

When the unselected one VLDi of the individual decoders VLD1-VLDn is selected and its operation switched from the passive decoding mode to the active decoding mode, it branches from its current entry state correctly established in the passive decoding mode to an appropriate one of its second states (indicated by encircled 2's in FIG. 3), and thenceforth to appropriate ones of a plurality of subsequent states, the last one of which is indicated by the encircled L in FIG. 3, which is representative of its last state. In this way, each of the individual decoders VLD1-VLDn, when selected, operates in an active decoding mode to decode the input bit stream according to its own code book until it finds the end of the current code word. In its last state, a selected decoder generates an "End of Word Found" signal (which corresponds to the end of word pulse EW in FIG. 1), and the controller 22, in response thereto, makes the decision as to which of the individual decoders VLD1–VLDn is the correct one for decoding the next code word contained in the input bit stream, based on the previously decoded code words, and according to the operative communication protocol.

In this regard, since the selected decoder has already predecoded the first bit of the next code word by the time it receives the delayed (pipelined) select decoder command (Select VLDi) from the controller 20, the first bit of the next code word is not skipped, as it would be with the presently available pipelined multi-code-book VLDs discussed hereinabove. Thus, the fully pipelined multi-code-book VLD 20 of the present invention eliminates the need for an input buffer to prevent the loss of data contained in the input bit stream in advance of the multi-code-book VLD 20.

In this connection, the architecture of the multi-code-book VLD 20 of the present invention allows "seamless" stitching between the individual decoders VLD1–VLDn. Such "seamless" stitching is achieved by virtue of the fact that, for each code word which is decoded by the multi-code-book VLD 20, all of the individual decoders VLD1–VLDn thereof are dynamically involved in the decoding process, regardless of their status, i.e., selected or unselected.

In the example illustrated in FIG. 3, a first code word is decoded by the decoder VLD3, a second code word is decoded by the decoder VLD1, and a third code word is decoded by the decoder VLD2. As can be readily seen, when the decoder VLD3 is decoding the first code word, it is in an active decoding mode, during which it advances sequentially from its first state "1" through its last state "L", in order to decode each sequential bit of the first code word, in accordance with its code book. While the decoder VLD3 is decoding the first code word, in an active decoding mode, the other decoders VLD1 and VLD2, which are not selected, are in a passive decoding mode, during which they branch between their respective entry states "1", advancing only one step forward, to thereby decode every bit of the input bit stream as if it were the beginning of a code word belonging to their own respective code book.

When the decoder VLD3 finishes decoding the last bit of the first code word (in its last state "L"), it generates an "End of Word Found" signal, and the controller 22, in response thereto, makes the decision "D" to select (activate) the decoder VLD1 to decode the second code word. As indicated by the bold-faced arrowheaded lines connected between the last state "L" of the process flow sequence for the decoder VLD3 and the three entry states "1" of the decoder VLD1, and the spacing between the last state "L" of the process flow sequence of the decoder VLD3 and the subsequent decision state symbol "D", the first bit of the second code word has already been predecoded by the decoder VLD1 by the time the decoder VLD 1 is selected (activated), to begin decoding the second code word.

When the decoder VLD1 is decoding the second code word, in an active decoding mode, the other decoders VLD2 and VLD3, which are not selected, are in a passive decoding mode, during which they branch between their respective entry states "1", advancing only one step forward, to thereby decode every bit of the input bit stream as if it were the beginning of a code word belonging to their own respective code book.

When the decoder VLD1 finishes decoding the last bit of the second code word (in its last state "L"), it generates an "End of Word Found" signal, and the controller 22, in response thereto, makes the decision "D" to select (activate) the decoder VLD2 to decode the third code word. As indicated by the bold-faced arrowheaded lines connected between the last state "L" of the process flow sequence for the decoder VLD1 and the three entry states "1" of the decoder VLD2, and the spacing between the last state "L" of the process flow sequence of the decoder VLD1 and the subsequent decision state symbol "D", the first bit of the third code word has already been predecoded by the decoder VLD2 by the time the decoder VLD2 is selected (activated), to begin decoding the third code word according to its own code book.

When the decoder VLD2 is decoding the third code word, in an active decoding mode, the other decoders VLD1 and VLD3, which are not selected, are in a passive decoding mode, during which they branch between their respective entry states "1", advancing only one step forward, to thereby decode every bit of the input bit stream as if it were the beginning of a code word belonging to their own respective code book.

The basic process sequence described above for decoding the first, second, and third code words contained in the input bit stream is repeated for each successive code word contained in the input bit stream.

Based upon the above and foregoing, it can now be appreciated that the fully pipelined multi-code-book VLD of the present invention overcomes the drawbacks and shortcomings of the presently available pipelined multi-code-book VLDs, and provides several significant advantages thereover.

More particularly, due to one-step passive predecoding of the input bit stream by all non-selected ones of the individual decoders (also referred to as "sub-decoders") VLD1–VLDn, the overall system decoding process is not interrupted, thereby enabling the decoding operation to be fully pipelined. Excellent speed performance is achieved as a result of this true pipelining, thereby enabling the use of higher decoding clock rates on one hand, and, on the other hand, eliminating the need to slow down the decoding process in order to manage the problem of delayed select decisions, and further eliminating the need for a large input buffer in front of the multi-code-book VLD, since the multi-code-book VLD of the present invention can manage 100% of the system throughput in real time.

Although a preferred embodiment of the present invention has been described in detail hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A multi-code-book variable length decoder for decoding an input bit stream containing a plurality of variable length code words, comprising:

a plurality of individual variable length decoders, each of said individual variable length decoders receiving the input bit stream and decoding the input bit stream according to a different respective code book;

a controller receiving the input bit stream and, for each successive code word contained in the input bit stream, selecting a correct one of said plurality of individual variable length decoders for decoding that code word; and, wherein each of said individual variable length decoders, when selected, operates in an active decoding mode to decode each successive bit of the input bit stream until detecting an end of a current code word contained in the input bit stream, and when not selected, operates in a passive decoding mode to pre-decode each successive bit of the input bit stream as if it were an initial bit of a next code word contained in the input bit stream.

2. The multi-code-book variable length decoder as set forth in claim 1, wherein each of said individual variable length decoders, when selected, produces an end-of-word signal upon detecting the end of said current code word.

3. The multi-code-book variable length decoder as set forth in claim 2, wherein said controller receives said end-of-word signals produced by said individual variable length decoders, and, in response thereto, makes a decision as to which one of said individual variable length decoders is the correct one for decoding said next code word, based on previously decoded code words, in accordance with a prescribed communication protocol.

4. The multi-code-book variable length decoder as set forth in claim 1, wherein each of said individual variable length decoders, when selected, produces a decoded word at its output.

5. The multi-code-book variable length decoder as set forth in claim 4, further comprising a multiplexer for multiplexing said decoded words produced by said individual variable length decoders to produce a decoded word stream at its output.

6. The multi-code-book variable length decoder as set forth in claim 3, wherein said controller determines the type of each successive code word contained in the input bit stream according to said prescribed communication protocol, based on previously decoded code words, and makes the decision as to which one of said individual variable length decoders is the correct one for decoding each successive code word, based on the thusly determined type of each successive code word.

7. The multi-code-book variable length decoder as set forth in claim 1, wherein:

each of said individual variable length decoders has a respective plurality of entry states and a respective plurality of subsequent states; and, each of said individual variable length decoders, when operating in said passive decoding mode, branches between its respective entry states according to the value of a current bit of the input bit stream.

8. The multi-code-book variable length decoder as set forth in claim 7, wherein each of said individual variable length decoders, in response to being selected by said controller, changes from said passive decoding mode to said active decoding mode, whereby it branches to an appropriate one of its respective subsequent states.

9. The multi-code-book variable length decoder as set forth in claim 6, wherein said prescribed communication protocol is an MPEG protocol.

10. The multi-code-book variable length decoder as set forth in claim 6, wherein:

each of said individual variable length decoders has a respective plurality of entry states and a respective plurality of subsequent states; and, each of said individual variable length decoders, when operating in said passive decoding mode, branches between its respective entry states according to the value of a current bit of the input bit stream.

11. The multi-code-book variable length decoder as set forth in claim 10, wherein each of said individual variable length decoders, in response to being selected by said controller, changes from said passive decoding mode to said active decoding mode, whereby it branches to an appropriate one of its respective subsequent states.

12. The multi-code-book variable length decoder as set forth in claim 1, wherein said controller controls the overall decoding operation of the multi-code-book variable length decoder in such a manner as to provide a fully pipelined operation of said individual variable length decoders, so that no input buffers are needed to compensate for decision latency of said controller in selecting the correct one of said plurality of individual variable length decoders for decoding each successive code word contained in the input bit stream.

13. The multi-code-book variable length decoder as set forth in claim 1, wherein, for each successive code word contained in the input bit stream, only the correct one of said plurality of individual variable length decoders is selected, and the remaining ones of said plurality of individual variable length decoders are not selected, whereby said correct, selected one of said plurality of individual variable length decoders operates in said active decoding mode, and said remaining, non-selected ones of said plurality of individual variable length decoders operate in said passive decoding mode.

14. The multi-code-book variable length decoder as set forth in claim 13, wherein:

each of said individual variable length decoders has a respective plurality of entry states and a respective plurality of subsequent states; and, each of said individual variable length decoders, when operating in said passive decoding mode, branches between its respective entry states according to the value of a current bit of the input bit stream.

15. The multi-code-book variable length decoder as set forth in claim 14, wherein each of said individual variable length decoders, in response to being selected by said controller, changes from said passive decoding mode to said active decoding mode, whereby it branches to an appropriate one of its respective subsequent states.

16. The multi-code-book variable length decoder as set forth in claim 15, whereby each of said individual variable length decoders, upon being selected by said controller, has already pre-decoded the first bit of said next code word contained in the input bit stream.

17. The multi-code-book variable length decoder as set forth in claim 11, whereby each of said individual variable length decoders, upon being selected by said controller, has already pre-decoded the first bit of said next code word contained in the input bit stream.

18. A multi-code-book variable length decoder for decoding an input bit stream containing a plurality of variable length code words, comprising:

a plurality of individual variable length decoders, each of said individual variable length decoders receiving the input bit stream and decoding the input bit stream according to a different respective code book;

a controller receiving the input bit stream and, for each successive code word contained in the input bit stream, selecting a correct one of said plurality of individual variable length decoders for decoding that code word; and, wherein said plurality of individual variable length decoders operate in a fully pipelined mode so that no input buffer is required to compensate for decision latency of said controller in selecting the correct one of said plurality of individual variable length decoders for each successive code word contained in the input bit stream.

19. The multi-code-book variable length decoder as set forth in claim 18, wherein, for each successive code word contained in the input bit stream, only the correct one of said plurality of individual variable length decoders is selected, and the remaining ones of said plurality of individual variable length decoders are not selected, whereby said correct, selected one of said plurality of individual variable length decoders operates in an active decoding mode to decode each successive bit of the input bit stream until detecting an end of a current code word contained in the input bit stream, and said remaining, non-selected ones of said plurality of individual variable length decoders operate in a passive decoding mode to pre-decode each successive bit of the input bit stream as if it were an initial bit of a next code word contained in the input bit stream and belonging to their own respective code book.

20. The multi-code-book variable length decoder as set forth in claim 19, whereby each of said individual variable length decoders, upon being selected by said controller, has already pre-decoded the first bit of said next code word contained in the input bit stream.

* * * * *